United States Patent [19]

Hess et al.

[11] Patent Number: 5,045,496
[45] Date of Patent: Sep. 3, 1991

[54] SEMI-INSULATING COBALT DOPED INDIUM PHOSPHIDE GROWN BY MOCVD

[75] Inventors: Kenneth L. Hess, Simi Valley; Stanley W. Zehr, Thousand Oaks, both of Calif.

[73] Assignee: Rockwell International Corporation, El Segundo, Calif.

[21] Appl. No.: 194,676

[22] Filed: May 13, 1988

[51] Int. Cl.$^5$ ............................................. H01L 21/20
[52] U.S. Cl. .............................. 437/81; 148/DIG. 23; 148/DIG. 40; 148/DIG. 110; 437/94; 437/959; 437/971; 156/613
[58] Field of Search .................... 148/DIG. 23, 40, 41, 148/56, 65, 72, 95, 110, 119, 169; 156/610-614; 427/248.1, 255.1; 437/81, 88, 126, 129, 133, 94, 959, 971

[56] References Cited

U.S. PATENT DOCUMENTS

| 4,321,073 | 3/1982 | Blair | 427/255 |
| 4,332,974 | 6/1982 | Fraas | 136/249 |
| 4,578,126 | 3/1986 | Rezek et al. | 437/120 |
| 4,864,581 | 9/1989 | Nelson et al. | 437/129 |

OTHER PUBLICATIONS

Hess et al, "Semi-Insulating InP Grown by Low Pressure MOCVD", J. Electron. Mat., vol. 16, No. 2, Mar. 1987, pp. 127-131.

Primary Examiner—Olik Chaudhuri
Assistant Examiner—William Bunch
Attorney, Agent, or Firm—Wilfred G. Caldwell; John C. McFarren

[57] ABSTRACT

A process is described for growing at least one layer doped with a transition element of cobalt on a substrate by introducing a source of indium, such as tri ethyl indium, $(C_2H_5)_3In$ or, a source of a group V element, a source of the transition element, such as cobalt nitrosyl tricarbonyl $CO(NO)(CO)_3$, and a source of phosphorus, to the substrate heated in an inert or reducing atmosphere at a pressure substantially between 1/100 atmosphere and one atmosphere to grow at least one semi-insulating semiconductor layer on the substrate.

10 Claims, 5 Drawing Sheets

SEMI-INSULATING COBALT DOPED INDIUM PHOSPHIDE GROWN BY MOCVD

BACKGROUND OF THE INVENTION

1. Field of the Invention

The present invention is a method for creating a cobalt doped indium phosphide epitaxial layer and a structure comprising a layer of cobalt doped indium phosphide.

2. Prior Art

U.S. Pat. Nos. 4,716,130 and 4,660,208 to Johnson Jr. et al set forth MOCVD methods for making Fe doped indium phosphide. However, there is no disclosure of the use of cobalt, nor low pressure MOCVD (LPMOCVD), nor of the parameters used in applicants' process.

BRIEF SUMMARY OF THE PRESENT INVENTION

LPMOCVD growth of semi-insulating epitaxial layers of cobalt doped InP has been achieved by incorporating cobalt as the transition metal dopant to achieve the requisite resistivity in LPMOCVD grown semi-insulating InP. Cobalt nitrosyl tricarbonyl (Co(NO)(CO)$_3$) is suitable as the precursor compound, compatible with LPMOCVD processing, and commercially available. In a structure consisting of an InP:S substrate overlayed by 1.1 $\mu$m of InP:Se, in turn having an epitaxial layer of 3.7 $\mu$m of InP:Co, the resistivity provides sufficient resistance to give effective electrical confinement in the BH laser structures.

DETAILED DESCRIPTION OF THE PREFERRED EMBODIMENT

Figure 1B:
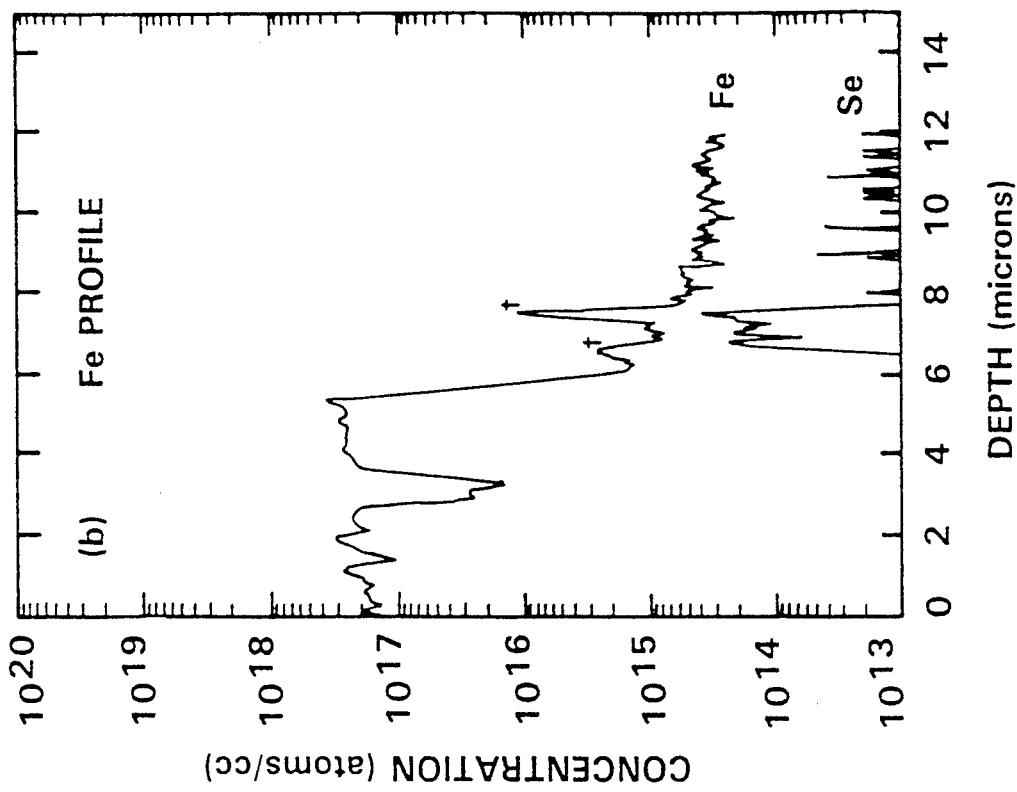
FIGS. 1A and 1B show secondary ion mass spectroscopy (SIMS) depth profiles of InP:Co and InP:Fe layers grown by LPMOCVD using (a) Co(NO)(CO)$_3$ and (b) Fe(CO)$_5$; iron pentacarbonyl.

Cobalt-doped semi-insulating epitaxial InP layers have been grown for the first time by low pressure metalorganic chemical vapor deposition (LPMOCVD). Cobalt nitrosyl tricarbonyl (CNT) was used as the dopant source. LPMOCVD process variables have been identified which produce semi-insulating InP:Co ($\rho \approx 10^5$ $\Omega$cm) with featureless surface morphology and layer thickness uniformity better than $\pm 5\%$ over 9 cm$^2$ substrates. SIMS depth profiles for InP:Co and similarly grown InP:Fe indicate variation of the transition metal impurity concentration with depth and, for the particular growth conditions examined, an order of magnitude less average Co concentration than Fe. Finally, performance characteristics of early V-groove buried crescent (BC) lasers incorporating such LPMOCVD grown semi-insulating InP:Co as current blocking layers are summarized. These lasers exhibit CW threshold currents as low as 8 ma at room temperature and high temperature operation up to 100° C.

INTRODUCTION

The fabrication and performance of high speed (11 GHz) and high power (42 mW/facet) 1.3 $\mu$m InGaAsP BC injection lasers has recently been reported. These lasers incorporate semi-insulating Fe-doped InP lateral current blocking layers grown by LPMOCVD. The iron impurity introduces a deep acceptor trap level [Fe$^{+3}$(3d$^5$)/Fe$^{-2}$(3d$^6$)] near the middle of the InP band gap at $E_c - 0.62$ eV in sufficient concentration to compensate residual shallow donors and produce semi-insulating behavior.

In addition to iron, other 3 d transition elements including titanium, vanadium, chromium, manganese, and cobalt have been studied with regard to their potential for inducing semi-insulating behavior in InP. In particular, both liquid phase epitaxy (LPE) and liquid-encapsulation Czochralski (LEC) techniques have been used to produce semi-insulating InP:Co exhibiting resistivities ranging between $\sim 10^4$–$10^5$ $\Omega$cm. Therefore, the possibility of growing epitaxial InP:Co by LPMOCVD for use as lateral carrier confinement material in semi-insulating BC (SIBC) lasers was investigated.

This application describes the first growth of semi-insulating InP:Co by LPMOCVD using cobalt nitrosyl tricarbonyl (Co(NO)(CO)$_3$, also known as CNT) as the transition metal dopant precursor. Selected properties of the semi-insulating InP:Co are compared with Fe-doped InP layers which are similarly grown by LPMOCVD using iron pentacarbonyl (Fe(CO)$_5$, also known as IPC) as the dopant source. Preliminary performance data for SIBC lasers having InP:Co current blocking layers are also described.

CNT belongs to a class of stable inorganic 3 d transition metal compounds known as $\pi$-acceptor ligand complexes. CNT was selected as the Co dopant source based upon its volatility (95 torr at 25° C.) and thermal stability over a wide temperature range (MP $\sim -112°$ C.; b.p. $\sim 78°$ C.). These properties permit conventional LPMOCVD techniques to be used for dopant control.

EXPERIMENTAL

Epitaxial InP:Co layers were grown over an InP:Se buffer layer grown on InP:S substrates in a low pressure (70 torr) vertical flow reactor (FIG. 5) that is known in the art. This structure is also used for SIBC lasers. Triethyl indium (TEI) and CNT were used as the Group III and transition metal dopant sources. Electronic grade phosphine (10% PH$_3$ in H$_2$ balance) and Pd-purified H$_2$ were used as the Group V source and carrier gases, respectively.

To serve as a reference point for the Co doping experiments, the electrically active net background doping density, carrier type, resistivity, and mobility of undoped layers were determined by standard Hall effect measurements at both 300 and 77K using a 5 kG magnetic field. The semi-insulating behavior of InP:Co layers was examined by measuring the room temperature I-V characteristics as previously detailed for InP:Fe layers. Layer thickness for both undoped and Co containing InP were determined by microscopic (SEM or optical) examination of cleaved and etched sample cross sections.

Both Co and Fe depth profiles were obtained by secondary ion mass spectroscopy (SIMS). The analyses used $O_2^+$ primary ions to sputter the samples. The positive secondary ions emitted from the semi-insulating layer during the sputtering process were then mass analyzed.

The measured secondary ion count rates for Co were converted to concentrations using an estimated sensitivity factor based on the relative sputtered ion yields of Co and Fe impurities in Si. Therefore, the Co concentrations in the InP:Co may be less accurate than those of Fe in InP:Fe samples where relative sensitivity factors are based upon previous measurements of Fe ion implant standards in InP.

Selenium concentration was monitored to serve as a buffer layer boundary indicator, but was not quantified. Depth scales were calibrated by depth measurements of the analytical craters using a Dektak stylus profilometer to an accuracy of 1093.

Preliminary 1.3 μm SIBC lasers were fabricated by a hybrid growth technique similar to that described previously for similar InP:Fe based devices. The technique involves an initial growth of a InP:Co semi-insulating current confinement layer by LPMOCVD, followed by an LPE regrowth of the active laser structure into etched channels. Details of the LPE regrowth of the SIBC laser structure have been previously published.

RESULTS

Baseline undoped InP layers growth by LPMOCVD exhibited n-type conductivity with 77K mobilities of $\mu_{77} \approx 7E4$ cm$^2$/V·sec and net carrier densities of $(N_D-N_A)_{77} \approx 5E14$ cm$^{-3}$. Typical undoped layer thicknesses were ~4 μm. The total ionized background impurity concentration of $(N_A+N_D)_{77} \approx 8E14$ cm$^{-3}$ was low enough to give semi-insulating InP:Co.

High resistivity ($\rho \approx 10^5$ Ωcm) epitaxial layers of Co-doped InP were obtained using CNT as the liquid dopant source. These layers exhibited p-type conductivity, in agreement with the Hall effect data that the electrical properties of InP:Co are controlled by a single acceptor trap level [Co$^{+3}$(3d$^6$)/Co$^{+2}$(3d$^7$)] at $E_v+0.32$ eV. Typical Co-doped layer thicknesses of ~4.5 μm gave rise to material exhibiting carrier densities of $(N_A-N_D) \approx 10^{13}$ cm$^{-3}$ and hole mobilities of $\mu \approx 50-150$ cm$^2$/V·sec at 300K.

Table 1 summarizes the growth conditions for semi-insulating InP:Co exhibiting both high resistivity ($\rho \approx 10^5$ Ωcm) and specular surface morphology over 9 cm$^2$. The growth rate (~250Å/min) corresponds to a H$_2$ flow of 1600 SCCM through the TEI bubbler at +25° C. The CNT bath temperature was maintained at −44° C. and the H$_2$ flow through the liquid dopant source controlled at 1 SCCM. The injection pressure ($\Delta P_{inj}$) within the dopant bubbler is regulated at +18 psig, while the CNT vapor pressure is estimated to be ~1.6 torr. A phosphine flow of 2000 SCCM (10% PH$_3$ in H$_2$) is used during the entire growth sequence.

Table 1

| Growth Parameters for Semi-Insulating InP:Co | |
|---|---|
| Substrate dimension | 9 cm$^2$ |
| Temperature | 640° C. |
| Pressure | 70 torr |
| [TEI]/[CNT] | ~380 |
| [PH$_3$]/[CNT] | ~8E4 |
| $\Delta P_{inj}$(CNT) | 18 psig |
| CNT bath temperature | −44° C. |
| Total gas flow | 6.0 SLPM |
| Growth rate | 250Å/min |

The growth rate for InP:Co is ~50 Å/min less than that typically observed for undoped InP. This suggests the possibility that highly reactive three-electron donor NO molecules ($\Delta F_g^o \approx 19.6$ kcal/mole at 640° C.), which are formed during thermal decomposition of CNT at temperatures near ~100° C., are reacting with electron deficient TEI species during the growth process. Such gas phase reactivity would deplete the concentration of available TEI for growth of InP:Co. Water formation from the gas phase reduction of NO with H$_2$ may also be partially responsible for altering the growth kinetics.

Smooth reflective surface morphology over 9 cm$^2$ was obtained for epitaxial InP:Co grown by LPMOCVD. Energy dispersive x-ray analysis (EDAX) of semi-insulating InP:Co layers indicated the presence of only In and P. We infer from lack of EDAX indication of Co that negligible second phase is formed having a concentration above the ~10$^{20}$ cm$^{-3}$ EDAX detection limit.

FIG. 1 illustrates the SIMS depth profiles for both semi-insulating InP:Co and InP:Fe layers grown by LPMOCVD using CNT and IPC, respectively. An obvious feature of the Co-profile is the extreme variation of the Co impurity concentration with depth within the semi-insulating layer. This suggests that Co dopant incorporation is not occurring uniformly during the LPMOCVD growth process. Additionally, the profile shows the Co concentration increasing progressively from the semi-insulating surface and extending into the epitaxial layer for several microns prior to quickly decreasing at ~1 μm from the selenium doped buffer layer interface.

There are two apparent interface concentration enhancement peaks (marked by a cross+) at both the InP:Co/InP:Se (buffer) and InP:Se/InP:S (substrate) interfaces. Similar peaks are also apparent for InP:Fe layers grown by LPMOCVD using IPC (FIG. 1B). In the Fe case, an isotopic SIMS analysis (secondary ion counts only) showed interface peaks for both the $^{54}$Fe and $^{56}$Fe profiles indicative of significant accumulation of Fe at each interface.

Since there is only one stable isotope of cobalt ($^{59}$Co), it is impossible to conclude from the SIMS data that Co accumulation is the origin of these effects in InP:Co layer. But supporting this interpretation, re-analysis of the sample at a reduced sputter rate confirmed both the complex Co depth variation and appearance of possible concentration spikes at each interface. These latter results are in excellent agreement with the initial profile and eliminate the possibility that variation in the Co ionization rate due to sputtering rate and/or ionization efficiency is the cause of the observed interface disturbances. Other possible explanations include (1) substrate contamination effects during etching, (2) a gettering phenomenon in which interface defects create a low energy sink for impurities, (3) contamination during growth, and (4) molecular interference.

In general, the SIMS profile of InP:Fe layers grown by LPMOCVD using IPC (FIG. 1B) appears to be more uniform than similarly grown InP:Co samples. The sudden decrease in Fe concentration observed between ~2.6 μm and ~3.6 μm is attributed to chilling of the IPC dopant source below −20° C. at which point the IPC solidifies resulting in a significant reduction in both vapor pressure and subsequent Fe incorporation into the Fe-doped layer.

The SIMS data further suggests that Fe diffusion is occurring through the selenium doped buffer layer and segregating (to a limited extent) at the buffer/substrate interface. It is not unreasonable to expect this type of behavior based on the reported diffusivity of Fe in InP at $\sim 700°$ C. of $\sim 5E-12$ cm$^2$/s. For semi-insulating layer thicknesses of $\sim 4-7$ $\mu$m, these structures are subject to high growth temperatures ($\sim 640°$ C.) for periods of several hours due to the low growth rates ($\sim 10^2$ Å/min) typical of these processes.

Figure 1A:
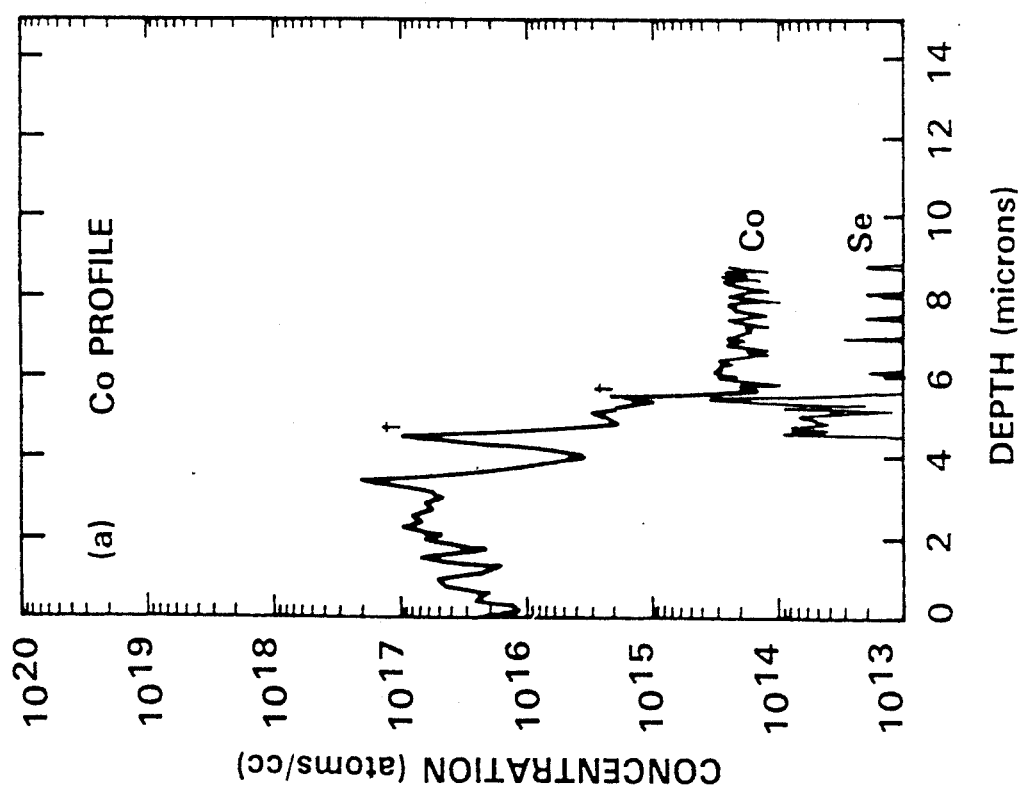

Since the reported diffusivity of Co in InP is greater than for Fe in InP between 600°–950° C., one might also expect similar Co diffusion processes to exist during the growth of InP:Co layers by LPMOCVD. Such diffusion would lead to Co accumulation at the buffer/substrate interface and explain the observed concentration enhancement peaks previously illustrated (FIG. 1a).

Another difference between the Co and Fe doped layers is the approximate order of magnitude greater average Fe concentration than Co, $\sim 2E17$ Fe/cm$^3$ compared to $\sim 3E16$ Co/cm$^3$. Since the samples were grown using nearly identical Co and Fe mole fractions in the inlet gas stream, the data imply that Co incorporation efficiency is less than that of Fe under similar conditions of growth. One possible explanation for these observations is the enhanced solubility of Fe in InP compared to Co at the growth temperatures being used in the LPMOCVD process.

Figures 2A, 2B:
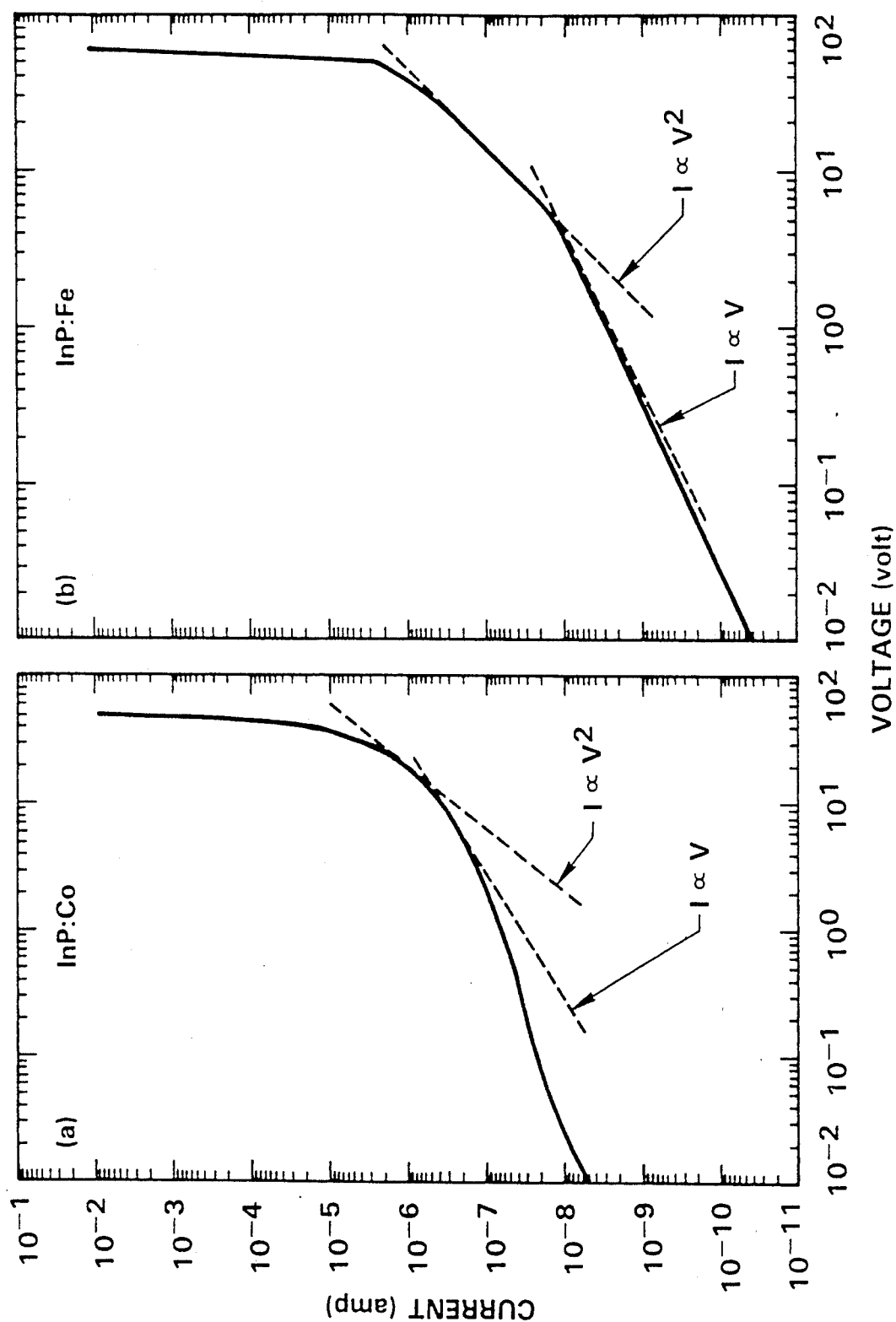
FIGS. 2A and 2B show log-log I-V curves for InP:Co and InP:Fe layers grown by LPMOCVD using (a) Co(NO)(CO)$_3$ and (b) Fe(CO)$_5$.

FIGS. 2A and 2B illustrate typical log-log I-V curves for semi-insulating InP:Co and InP:Fe layers respectively. According to Lampert's theory of current injection into insulators having ohmic contacts, if the controlling trap level lies above the equilibrium Fermi level, the I-V curve should exhibit: (1) an ohmic region at low applied voltages and (2) above some transition voltage, a region where the current increases proportional to the square of the applied voltage. Examination of the I-V curves for both InP:Co and InP:Fe samples reveals that only the Fe-doped samples obey Lampert's theory. The I-V characteristic of the InP:Co semi-insulating layer is clearly sub-ohmic at low applied voltages and shows no clear transition to I $\alpha$ V$^2$ behavior before reaching the sharp current rise associated with complete trap filling with injected carriers. The anomalous behavior in the Co-doped case is not completely understood, but may be due to the presence of rectifying contacts and/or the n$^+$p$^-$ junction between the InP:Se buffer layer and the overlying InP:Co. The Fe-doped I-V behavior reported here is similar to both Fe ion implanted InP and MOCVD grown InP:Fe using ferrocene.

Figure 5:
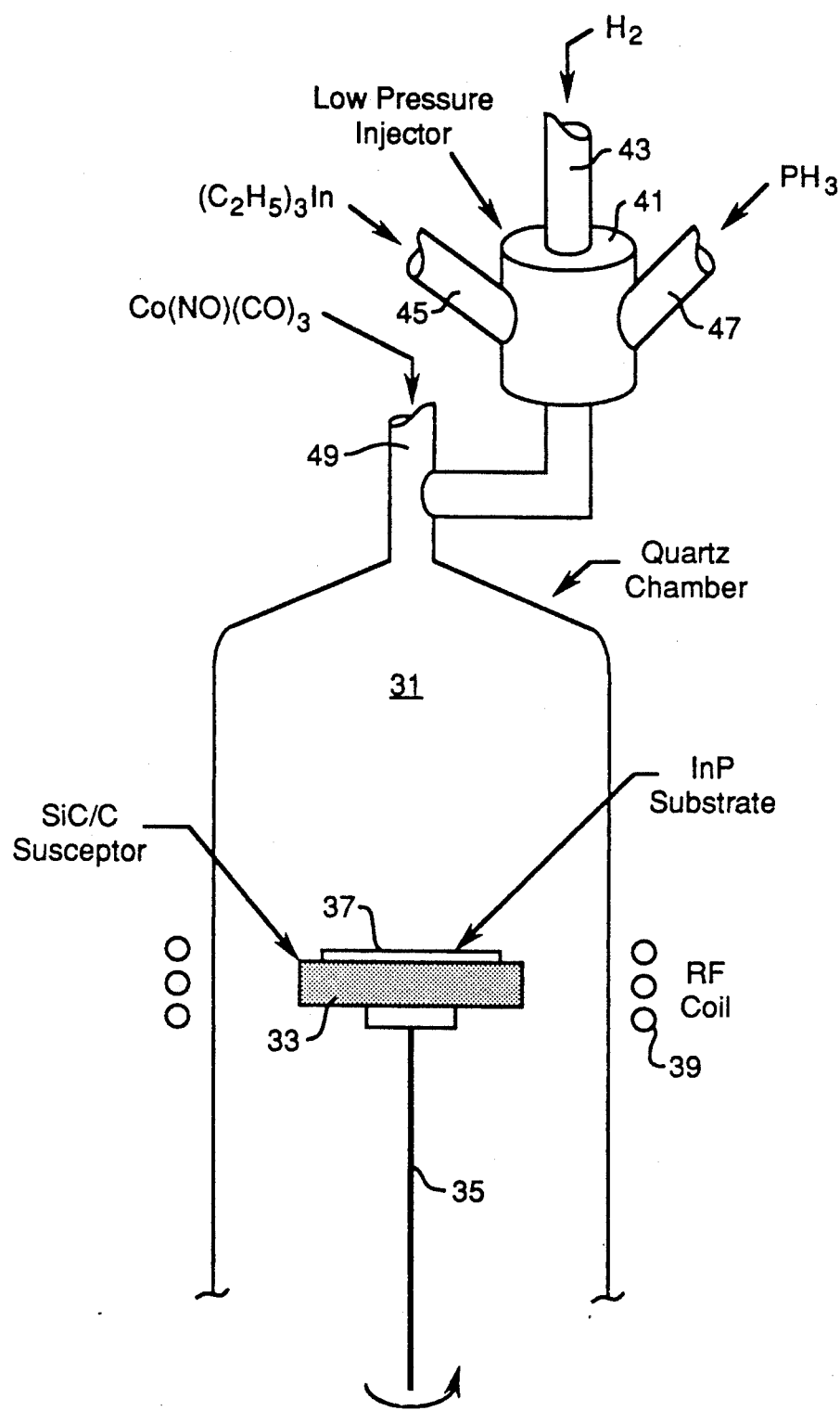
FIG. 5 shows a vertical flow LPMOCVD reactor configuration.

Despite the anomalous I-V behavior and the variation of the Co impurity concentration with depth, the InP:Co epilayers have been used successfully as semi-insulating current confinement layers in 1.3 $\mu$m SIBC lasers fabricated with a hybrid MOCVD/LPE growth technique (FIG. 5). Early devices of this type have operated with CW threshold currents as low as 8 ma and CW optical output power levels in execess of 30 mW/facet at 23° C.

Figures 4A, 4B:
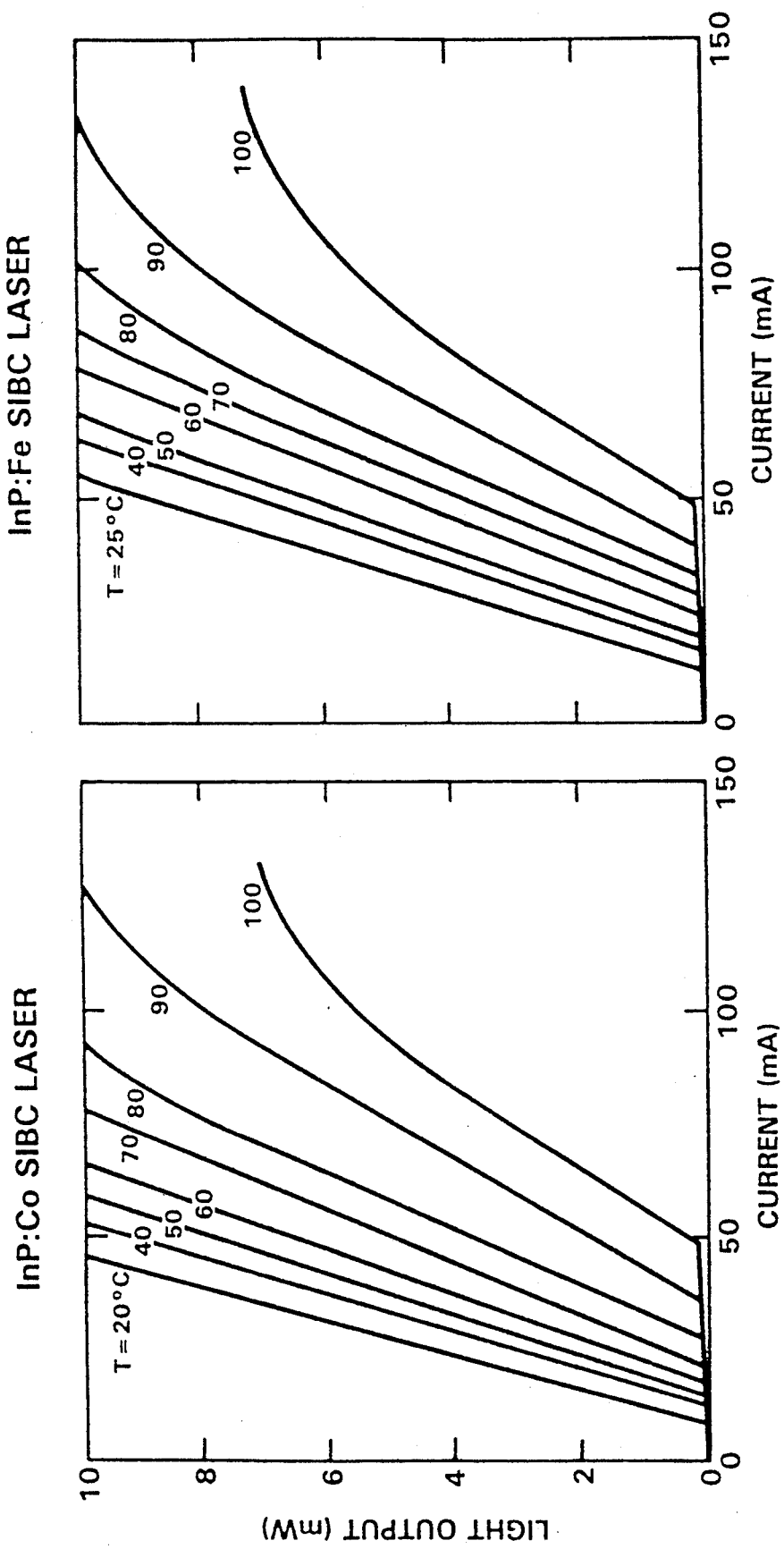
FIGS. 4A and 4B show temperature dependent CW light current characteristics of hybrid SIBC 1.3 $\mu$m lasers (a) InP:Co, (b) InP:Fe current blocking layer.

FIGS. 4A and 4B compare the temperature dependent CW light-current characteristics of typical hybrid 1.3 $\mu$m lasers using InP:Co and InP:Fe current blocking layers grown by LPMOCVD. To our knowledge, 8 ma represents the lowest threshold current yet reported for an InGaAsP laser with semi-insulating InP:Co current confinement layer, and is comparable to previously reported Fe-doped lasers.

The results presented here show that CNT can be used as a Co dopant precursor to produce semi-insulating epitaxial InP grown by LPMOCVD. The resulting InP:Co material can be used as an effective lateral current confinement layer in V-groove SIBC InGaAsP lasers emitting at 1.3 $\mu$m and exhibiting threshold currents as low as 8 ma and optical outputs greater than 30 mW/facet.

Figure 3:
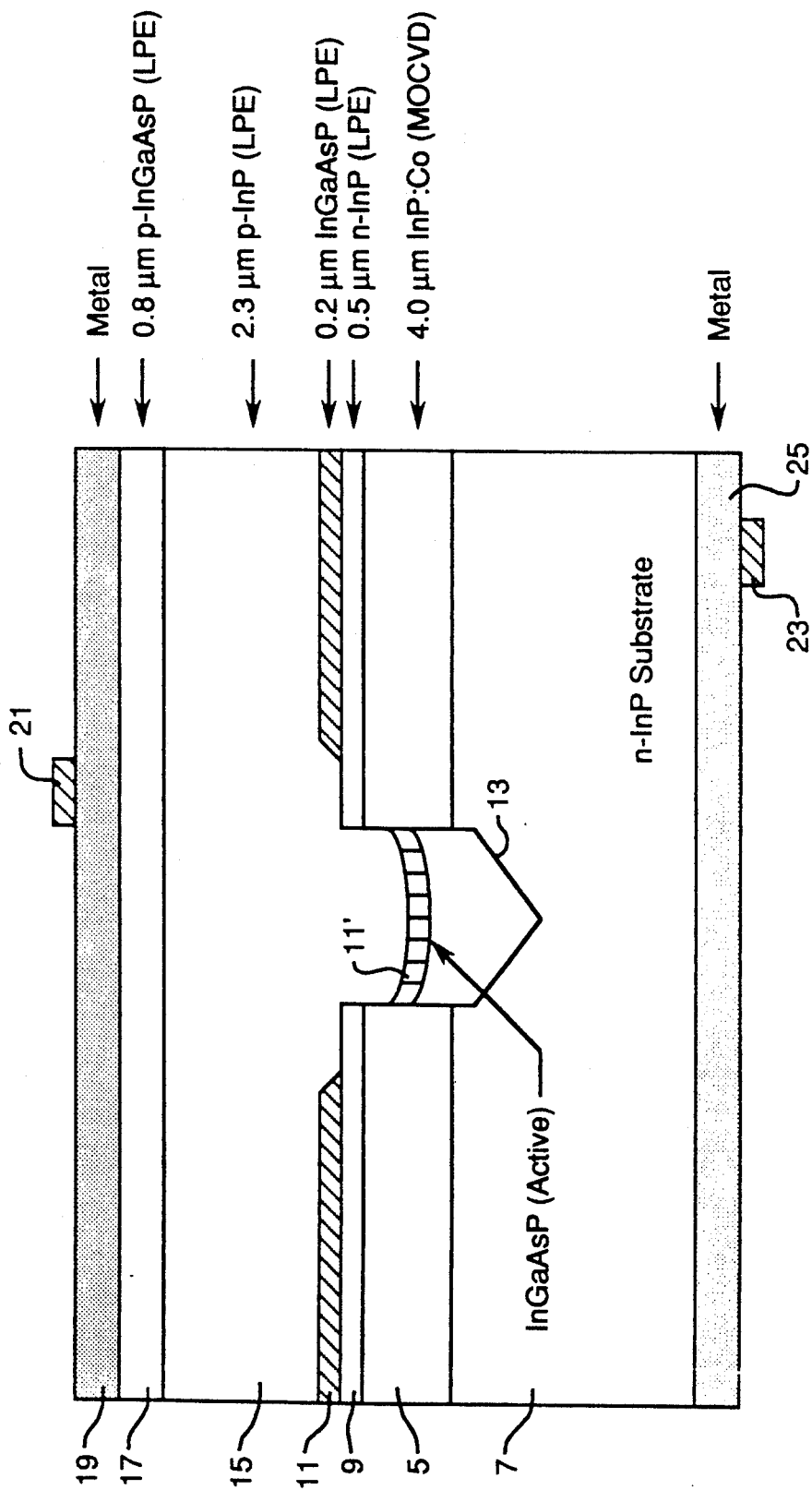
FIG. 3 shows the structure of a laser made according to the invention.

The structure of FIG. 3 will next be detailed, with reference to the process carried out by the reactor of FIG. 5, and the growth parameters summarized in Table 1.

The layer 3 in FIG. 5 is the cobalt doped indium phosphide layer vapor deposited on n-InP bulk single crystal substrate 7. It has been found that this epitaxial cobalt doped layer does not require a planar surface for growth. Also, LPMOCVD, down to 1/100 of an atmosphere, is suitable for growing this layer, which also can be grown at atmospheric pressure. Either a reducing or inert atmosphere will support growth of this semi-insulating semiconductor layer 5.

The use of MOCVD permits larger growth areas, such as 3" wafers, and the cobalt permits epitaxial growth on any substrate. Layer 5 can also be grown over selected areas or as a layer to isolate devices in an integrated circuit. However, the use of MOCVD permits better uniformity and is more reproducible.

In FIG. 3, an 0.5 $\mu$m n-InP layer 9 is formed by conventional LPE processing.

Layer 11 of InGaAsP is similarly formed to a thickness of 0.2 $\mu$m.

Groove 13 penetrates these layers and extends into substrate 7 to make contact between the substrate and active region 11' which was a portion of the InGaAsP layer 11.

P-InP layer 15 is 2.3 $\mu$m thick and processed by LPE. Its purpose is that of a waveguide for photons generated in active layer 11'.

Layer 17, comprising 0.8 $\mu$m p-InGaAsP, is a low band gap semiconductor for establishing good contact with metallization layer 19. Metal contact 21 is formed on layer 19 as is contact 23 formed on metallization layer 25 for enabling energy application to produce laser light from the structure of FIG. 3.

In FIG. 8, a conventional reactor 31 may be used to carry out the process of the present invention. Quartz chamber 31 contains the mixture of reactants and carrier gas at the selected pressure, e.g., 1/10 atmosphere. Also, the SiC/C (silicon carbide coated graphite) SUSCEPTER 33 is supported within chamber 31 for rotation by shaft 35.

The InP SUBSTRATE 37 is carried on susceper 33 and, as shown, comprises an area of approximately 9 cm$^2$.

RF coil 39 encompasses the region of the substrate 37, to generate sufficient heat for growth temperature.

LOW PRESSURE INJECTOR 41 receives H$_2$, as the carrier gas, via conduit 43, the source of indium, i.e., (C$_2$H$_5$)$_3$In (tri ethyl indium) as a liquid via conduit 45, and the source of phosphorus, e.g., PH$_3$ via conduit 47. PH$_3$ may comprise 10% phosphine in hydrogen.

Chamber 31 directly receives the source of cobalt, e.g., Co(NO)(CO)$_3$ In via pipe 49. This cobalt nitrosyl carbonyl liquid has a high vapor pressure and is cooled down to $-44°$ C.

The growth parameters of Table 1 for carrying out the preferred processing include the substrate dimension of 9 cm$^2$ but larger reactors will take 3" diameter wafer substrates. RF coil 39 generates the 640° C. temperature, but a typical range could be 550°–650° C. The preferred pressure of 70 Torr has been explained as encompassing 1/100 to 1 atmos.

[TEI]/[CNT] is the molar ratio of the indium reactant material to the cobalt reactant material which should be approximately 380.

The molar ratio of phosphorus reactant material to the cobalt reactant material [PH$_3$]/[CNT] may be approximately 8E4.

The pressure over the cobalt source $p_{inj}$ (CNT) is 18 psig. The back pressure regulator controls and needle valve regulate this.

By using CNT bath temperature at the proper vapor pressure of CNT (cobalt nitrosyl carbonyl) is maintained.

The total gas flow, which is the sum of everything going through the reactor, should be approximately 6.0 SLPM.

Finally, the growth rate of 250A/min measures the rate of increase in thickness of the layer 5 during LPMOCVD epitoxial growth.

In summary, the subject process is capable of growing at least one layer doped with a transition element on a substrate by introducing a source of a group III element, a source of a group V element and a source of a transition element to the substrate heated in either an inert atmosphere or a reducing atmosphere to grow at least one semi-insulating semiconductor layer on the substrate.

What is claimed is:

1. A process for growing a cobalt doped semi-insulating layer on a substrate, comprising the steps of:
   introducing a source of a group III element, a source of a group V element, and cobalt nitrosyl tricarbonyl as a source of cobalt into an inert or reducing atmosphere at a total pressure between about 1/100 atmosphere and one atmosphere; and
   heating the substrate in said atmosphere to grow the semi-insulating layer on the substrate.

2. The process of claim 1, wherein the step of introducing a source of a group III element comprises introducing a metal alkyl.

3. The process of claim 2, wherein the step of introducing a metal alkyl comprises introducing triethyl indium.

4. The process of claim 1, wherein the step of introducing a source of a group V element comprises introducing a hydride or an alkyl of said group V element.

5. The process of claim 4, wherein the step of introducing a hydride or an alkyl of said group V element comprises introducing phosphine.

6. The process of claim 1, wherein the step of introducing elements comprises introducing triethyl indium, phosphine, and cobalt nitrosyl tricarbonyl into said atmosphere to grow a cobalt doped indium phosphide semi-insulating layer.

7. The process for growing at least one layer doped with a transition element of cobalt on a substrate, comprising the steps of:
   introducing tri ethyl indium (C$_2$H$_5$)$_3$ In or TEI, and cobalt nitrosyl carbonyl to said substrate heated in a reducing atmosphere at a pressure substantially between 1/100 atmosphere and one atmosphere to grow at least one semi-insulating semiconductor layer on the substrate.

8. A process for growing a cobalt doped indium phosphide semi-insulating layer on a substrate, comprising the steps of:
   introducing a source of indium, a source of phosphorus, and cobalt nitrosyl tricarbonyl as a source of cobalt into a vapor deposition chamber at a pressure not greater than about one atmosphere; and
   heating the substrate in said chamber to grow the semi-insulating layer on the substrate.

9. The process of claim 8, wherein the step of introducing a source of indium comprises introducing triethyl indium.

10. The process of claim 9, wherein the step of introducing a source of phosphorus comprises introducing phosphine.

* * * * *